(12) United States Patent
Roettger et al.

(10) Patent No.: US 8,242,020 B2
(45) Date of Patent: Aug. 14, 2012

(54) METHOD FOR PRODUCING A SEMICONDUCTOR WAFER

(75) Inventors: Klaus Roettger, Bachmehring (DE); Gerhard Heier, Burghausen (DE); Alexander Heilmaier, Haiming (DE)

(73) Assignee: Siltronic AG, Munich (DE)

( * ) Notice: Subject to any disclaimer, the term of this patent is extended or adjusted under 35 U.S.C. 154(b) by 311 days.

(21) Appl. No.: 12/547,749

(22) Filed: Aug. 26, 2009

(65) Prior Publication Data

US 2010/0055908 A1 Mar. 4, 2010

(30) Foreign Application Priority Data

Aug. 27, 2008 (DE) .................. 10 2008 044 646

(51) Int. Cl.
*H01L 21/302* (2006.01)
(52) U.S. Cl. ............... 438/693; 438/692; 216/89
(58) Field of Classification Search .......... 438/691, 438/692, 693, 694; 216/88, 89; 451/60, 451/63, 143
See application file for complete search history.

(56) References Cited

U.S. PATENT DOCUMENTS

| | | | |
|---|---|---|---|
| 6,027,669 A | 2/2000 | Miura et al. | |
| 6,299,514 B1 | 10/2001 | Boller | |
| 6,530,826 B2 * | 3/2003 | Wenski et al. | 451/41 |
| 6,899,762 B2 | 5/2005 | Wenski et al. | |
| 7,008,308 B2 * | 3/2006 | Bjelopavlic et al. | 451/269 |
| 2001/0003672 A1 | 6/2001 | Inoue et al. | |
| 2002/0055324 A1 | 5/2002 | Wenski et al. | |
| 2006/0057850 A1 * | 3/2006 | Britt et al. | 438/690 |
| 2007/0186486 A1 * | 8/2007 | Iwasa | 51/308 |
| 2007/0212289 A1 * | 9/2007 | Park et al. | 423/263 |
| 2008/0070483 A1 | 3/2008 | Roettger et al. | |
| 2008/0081541 A1 | 4/2008 | Kozasa et al. | |

FOREIGN PATENT DOCUMENTS

| | | |
|---|---|---|
| CN | 1185471 A | 6/1998 |
| DE | 10007390 A1 | 10/2000 |
| DE | 10012840 A1 | 4/2001 |
| DE | 69925199 T2 | 2/2006 |
| JP | 11347926 A | 12/1999 |
| JP | 2005158798 A | 6/2005 |
| JP | 2005254401 A | 9/2005 |
| JP | 2007214205 A | 8/2007 |
| KR | 394972 A | 8/2003 |

* cited by examiner

*Primary Examiner* — Lan Vinh
(74) *Attorney, Agent, or Firm* — Leydig, Voit & Mayer, Ltd.

(57) ABSTRACT

A method for producing a semiconductor wafer. The method includes placing the semiconductor wafer in a cutout in a carrier. Both sides of the semiconductor wafer are polished between an upper and a lower polishing plate with a polishing agent until the thickness of the center of the semiconductor wafer is less than the thickness of the carrier and from 10 μm to 30 μm of semiconductor wafer material is removed. The polishing agent contains 0.1 to 0.4% by weight of $SiO_2$ and 0.1 to 0.9% by weight of an alkaline component.

7 Claims, 2 Drawing Sheets

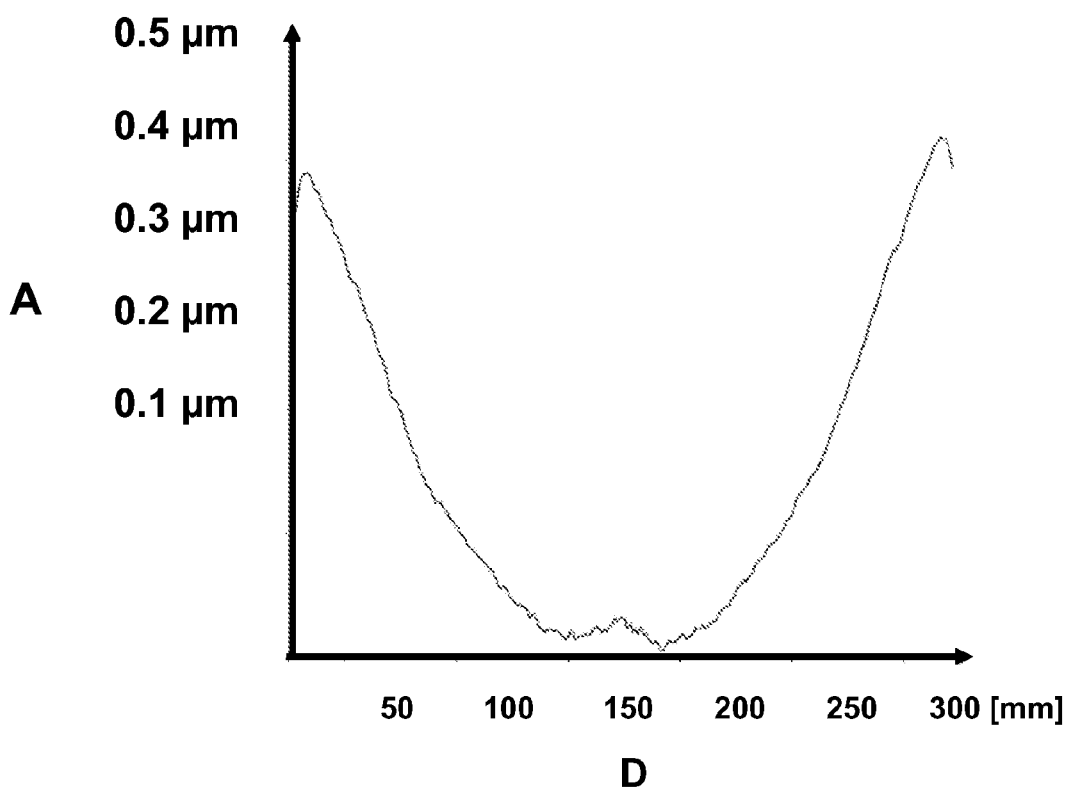

METHOD FOR PRODUCING A SEMICONDUCTOR WAFER

CROSS REFERENCE TO PRIOR APPLICATIONS

Priority is claimed to German Patent Application No. DE 10 2008 044 646.7, filed Aug. 27, 2008. The entire disclosure of said application is incorporated by reference herein.

FIELD OF THE INVENTION

The present invention provides for a method for producing a semiconductor wafer, for example, a semiconductor wafer composed of silicon, which pursues the aim of making available a semiconductor wafer having an improved flatness, such as in the edge region. The present invention relates to a method comprising polishing a semiconductor wafer between an upper and a lower polishing plate, wherein the semiconductor wafer, lying in a cutout in a carrier, is polished on both sides, with a polishing agent being supplied, until the difference between the thickness of the semiconductor wafer in the center of the semiconductor wafer and the thickness of the carrier is negative. Such a method can be suitable for producing particularly flat semiconductor wafers.

BACKGROUND OF THE INVENTION

The flatness of a semiconductor wafer is a central quality parameter used for assessing the fundamental suitability of the semiconductor wafer as a substrate for producing the most modern generation of electronic components. An ideally flat semiconductor wafer having completely flat side areas opposite one another in parallel fashion would not bring about any focusing difficulties for the stepper during the lithography in the course of producing components. It is therefore endeavored to attain this ideal form as closely as possible. For this purpose, a semiconductor wafer sliced from a crystal undergoes a series of machining steps, wherein, for example, the mechanical machining at the start of the process by means of lapping and/or grinding of the side areas serves for shaping. Subsequent steps such as the etching of the semiconductor wafer and the polishing of the side areas are effected primarily in order to eliminate damage near the surface that has been left behind by the mechanical machining steps, and in order to smooth the side areas. At the same time, these subsequent steps influence the flatness of the semiconductor wafer to a critical extent and all efforts aim as far as possible to retain the flatness obtained by the mechanical machining steps.

A series of standardized parameters are available for the quantitative characterization of the flatness. This also applies, for example, to the region of the edge of the front side of the semiconductor wafer, where front side is usually taken to mean that side of a semiconductor wafer which is used as a basis for the integration of electronic components.

The manufacturers of electronic components endeavor also to include the region of the edge as comprehensively as possible in the usable area FQA, "Fixed Quality Area". Accordingly, the specified permitted edge exclusion "EE" is becoming ever smaller. Present specifications permit an edge exclusion of only 1 mm.

Unevenness can be described by a SFQR value. The SFQR value denotes the local flatness in a measurement zone having a specific dimensioning, for example, an area of 20 mm×20 mm, to be precise in the form of the maximum height deviation of the front side of the semiconductor wafer in the measurement zone with respect to a reference area having the same dimensioning that is obtained by error square minimization. Partial sites are measurement zones in the edge region which are no longer fully part of the FQA, but the center of which still lies in the FQA. A PSFQR value denotes the local flatness in partial sites, as does an ESFQR value. The latter is based on a more comprehensive metric.

Alongside the local flatness, it is always necessary to also take account of the global flatness of the front side of the semiconductor wafer. Standardized parameters for describing the global flatness are the GBIR value and the SBIR value, which correlates with this value. Both parameters express the maximum height deviation of the front side relative to a rear side—assumed to be ideally flat—of the semiconductor wafer and differ in that the FQA is used for calculation in the case of the GBIR value, while the area restricted to the measurement zone is used for calculation of the SBIR value.

Definitions of the abovementioned parameters and descriptions of methods for measuring said parameters are contained in the relevant SEMI standards, in particular in the M1, M67 and M1530 standards.

It is known that double-side, simultaneously effected polishing of the semiconductor wafer, hereinafter referred to as "DSP polishing", favorably influences the local flatness. The material removal in the course of a DSP polishing, amounting to 5 µm to 15 µm per side, is significantly higher than the material removal sought with a CMP polishing ("Chemical Mechanical Polishing"). A machine suitable for DSP polishing is described, for example, in DE 100 07 390 A1. During the DSP polishing, the semiconductor wafer lies in a cutout provided for it in a carrier acting as a guide cage, and between an upper and a lower polishing plate. At least one polishing plate and the carrier are rotated, and the semiconductor wafer moves, with a polishing agent being supplied, on a path predetermined by a rolling curve relative to the polishing plates covered with polishing cloth. The polishing pressure with which the polishing plates press onto the semiconductor wafer and the duration of the polishing are parameters that crucially codetermine the material removal brought about by the polishing.

US 2002/0055324 A1 describes a DSP polishing which is terminated by replacing the polishing agent with a stopping reagent at the end of the polishing. The polishing agent described therein has a typical composition. It contains, for example, silicon dioxide ($SiO_2$) in an amount of 1 to 10% by weight and an alkaline component in an amount of 0.01 to 10% by weight.

US2008/0070483 A1 describes a method comprising two successive polishing steps that are each carried out as DSP polishing. The first polishing step involves polishing a semiconductor wafer until the difference between the thickness of the semiconductor wafer in the center of the semiconductor wafer and the thickness of the carrier is negative. A semiconductor wafer having a concave form deviating from the ideal form is obtained in this way. What is advantageous about the method is that the local flatness in the edge region of the front side of the semiconductor wafer has a PSFQR value of not more than 35 nm and thus lies in a range regarded as favorable as early as after the first polishing step. What is disadvantageous about the method is that a second DSP polishing is required in order to bring the global flatness of the front side of the semiconductor wafer to an SBIR value of less than 100 nm.

SUMMARY OF THE INVENTION

An aspect of the present invention is to provide for a method for producing a semiconductor wafer which comprises a DSP polishing that leads to a significant improvement both in the global flatness and in the local flatness of the front side of the semiconductor wafer.

In an embodiment, the present invention provides for a method for producing a semiconductor wafer. The method includes placing the semiconductor wafer in a cutout in a carrier. Both sides of the semiconductor wafer are polished between an upper and a lower polishing plate with a polishing agent until the thickness of the center of the semiconductor wafer is less than the thickness of the carrier and from 10 μm to 30 μm of semiconductor wafer material is removed. The polishing agent contains 0.1 to 0.4% by weight of $SiO_2$ and 0.1 to 0.9% by weight of an alkaline component.

BRIEF DESCRIPTION OF THE DRAWINGS

The present invention is described in greater detail below on the basis of embodiments and of the drawings in which:

FIG. 2 shows the surface contour of the front side, recorded as distance A along the diameter D of the semiconductor wafer, from a respective semiconductor wafer in accordance the prior art.

DETAILED DESCRIPTION OF THE INVENTION

Figure 1:
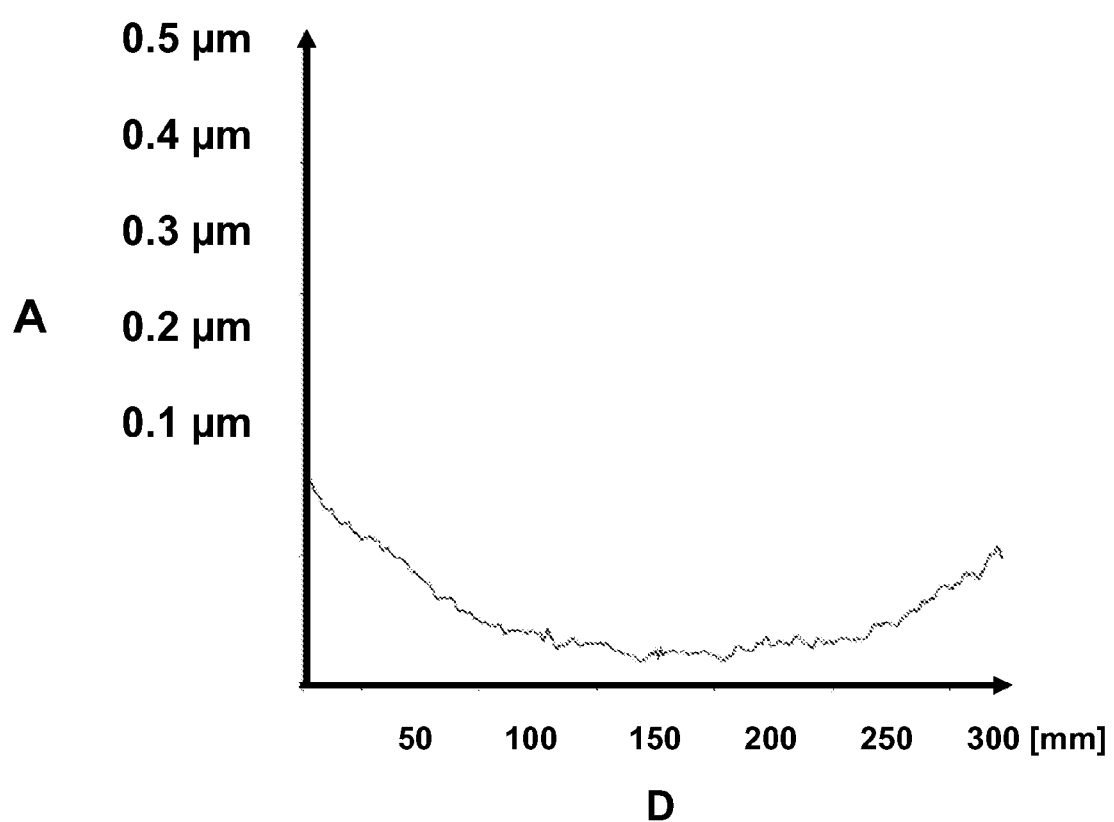
FIG. 1 shows the surface contour of the front side, recorded as distance A along the diameter D of the semiconductor wafer, from a respective semiconductor wafer in accordance with the present invention.

The inventive method differs from the method described in US2008/0070483 A1, for example, in that a polishing agent is used which contains $SiO_2$ and an alkaline component in a significantly lower concentration than usual. This difference has the effect that the front side of the semiconductor wafer is curved more weakly in the edge region after polishing and there are smaller differences in thickness between center region and edge region. Accordingly, the global flatness, in particular the SBIR value, is improved. Furthermore, an improvement in the local geometry, in particular in the PSFQR value and the ESFQR value, is also obtained. The method only comprises, for example, a single and no further DSP polishing.

$SiO_2$ and the alkaline component are, for example, not mixed together until directly (60 to 1 s) before the polishing agent is used, such that the polishing agent arises only at the point of use. This measure counteracts, for example, gelation.

The DSP polishing is carried out until the difference between the thickness of the semiconductor wafer in the center of the semiconductor wafer and the thickness of the carrier, hereinafter referred to as "underhang," is negative or, for example, lies in a range of –2.5 to –5 μm, such as in a range of –2.5 to –3.5 μm. The polishing agent contains 0.1 to 0.4% by weight of $SiO_2$ and, for example, 0.2 to 0.8% by weight of an alkaline component. An additional example is 0.2 to 0.3% by weight of $SiO_2$ and 0.5 to 0.7% by weight of the alkaline component. Alkaline component is taken to mean at least one of the following compounds: sodium carbonate, potassium carbonate, sodium hydroxide, potassium hydroxide, tetramethylammonium hydroxide (TMAH) and other quaternary ammonium compounds. If the alkaline component comprises more than one compound, the sum of their concentrations is intended to lie in the concentration range specified above.

The starting product for the method is, for example, a semiconductor wafer which has been sliced from a single crystal of silicon and has been machined mechanically by lapping and/or grinding of the side areas, that is to say the front and rear sides of the semiconductor wafer. The front side is deemed to be the side area intended for forming the surface for creating structures of electronic components. The edge of the semiconductor wafer may already have been rounded in order to make it less sensitive to impact damage. Furthermore, damage near the surface as a consequence of the preceding mechanical machining has largely been eliminated by an etch in an acidic and/or alkaline etchant. Furthermore, the semiconductor wafer may already have been subjected to further machining steps, in particular cleaning steps or polishing of the edge. In accordance with the method claimed, the semiconductor wafer can be polished simultaneously on both sides, wherein the DSP polishing, for increasing the productivity can be, for example carried out as multi-wafer polishing involving the use of a plurality of carriers each having a plurality of cutouts for semiconductor wafers. The method according to the present invention, for example, comprises no further DSP polishing. It is expedient, however, to smooth the front side after the DSP polishing by means of a single-side polishing (CMP polishing). The material removal associated with this is typically 0.2 μm-0.5 μm.

EXAMPLES

Inventive (E) and Prior Art/Comparative (C)

Semiconductor wafers composed of silicon having a diameter of 300 mm were sliced from a single crystal and pretreated in the same way in each case by means of a mechanical machining and an etch. They were subsequently polished in a double-side polishing machine from Peter Wolters AG of the type AC 2000 until an underhang of –0.9 μm (C) and –3.55 μm (E), respectively, had been achieved. One portion of the semiconductor wafers (E) was polished according to the present invention using a polishing agent that contained $SiO_2$ in a concentration of 0.3% by weight and an alkaline component comprising 0.2% by weight of potassium carbonate and 0.02% by weight of potassium hydroxide.

A further portion of the semiconductor wafers (C) was polished with an almost identical polishing agent, but the concentration of $SiO_2$ was 1.5% by weight, that of potassium carbonate was 2% by weight and that of potassium hydroxide was 0.07% by weight.

The global flatness and local flatness of the polished semiconductor wafers were investigated using a measuring device of the type WaferSight from KLA-Tencor (FQA=298 mm and EE=1 mm). The results are compiled in the table below.

TABLE

| | Total material removal [μm] | Underhang [μm] | GBIR [μm] | SBIR [μm] | PSFQR [μm] | ESFQR [μm] |
|---|---|---|---|---|---|---|
| E | 23.17 | –3.55 | 0.24 | 0.072 | 0.02 | 0.129 |
| C | 20.69 | –0.91 | 0.48 | 0.157 | 0.058 | 0.214 |

The values indicated are in each case average values formed from a plurality of individual values. The results show, for example, that the global flatness is improved by application of the method according to the present invention even if the underhang as in the example with –3.55 μm is significantly higher than in the comparative example. In accordance with the teaching in US2008/0070483 A1, deterioration in the GBIR value and the SBIR value would much rather have been expected.

FIGS. 1 and 2 show the surface contour of the front side, recorded as distance A along the diameter D of the semiconductor wafer, from a respective semiconductor wafer in accordance with the inventive example (FIG. 1) and prior art/comparative example (FIG. 2). The semiconductor wafer according to the inventive example (FIG. 1) is very flat both with regard to the global flatness and with regard to the flatness in the edge region. For example, only a small edge roll-off is present. By contrast, the semiconductor wafer in accordance with the prior art/comparative example (FIG. 2) exhibits a pronounced edge roll-off, despite a wafer shape formed in more highly concave fashion.

What is claimed is:

1. A method for producing a semiconductor wafer, the method comprising:
    disposing the semiconductor wafer in a cutout in a carrier; and
    polishing both sides of the semiconductor wafer between an upper and a lower polishing plate with a polishing agent until the difference between the thickness of the center of the semiconductor wafer and the thickness of the carrier is −2.5 µm to −5 µm and until from 10 µm to 30 µm of semiconductor wafer material is removed,
    wherein the polishing agent contains 0.1 to 0.4% by weight of $SiO_2$ and 0.1 to 0.9% by weight of an alkaline component, and
    wherein no further double side polishing (DSP) is carried out.

2. The method as recited in claim 1, wherein the polishing agent contains 0.2 to 0.3% by weight $SiO_2$ and 0.5 to 0.7% by weight of an alkaline component.

3. The method as recited in claim 1, wherein the difference between the thickness of the center of the semiconductor wafer and the thickness of the carrier is −2.5 µm to −3.5 µm.

4. The method as recited in claim 1, wherein the alkaline component contains at least one of potassium carbonate, sodium hydroxide, potassium hydroxide, tetramethylammonium hydroxide or other quaternary ammonium compounds.

5. The method as recited in claim 1, wherein the alkaline component contains at least one of potassium carbonate or tetramethylammonium hydroxide.

6. The method as recited in claim 1, wherein $SiO_2$ and the alkaline component are not mixed together until directly before the polishing agent is used.

7. The method as recited in claim 6, wherein the $SiO_2$ and the alkaline component are mixed together from 1 sec to 60 sec before the polishing agent is used.

* * * * *